(12) United States Patent
Allardyce et al.

(10) Patent No.: US 6,265,020 B1
(45) Date of Patent: Jul. 24, 2001

(54) FLUID DELIVERY SYSTEMS FOR ELECTRONIC DEVICE MANUFACTURE

(75) Inventors: George R. Allardyce, Warwickshire (GB); John J. Bladon; David Oglesby, both of Marlborough, MA (US); Inna Sinitskaya, Sudbury, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/387,472

(22) Filed: Sep. 1, 1999

(51) Int. Cl.[7] .......................................... B05D 1/36
(52) U.S. Cl. ................. 427/96; 427/424; 427/427; 118/314; 118/316; 216/13; 205/145; 205/137; 134/36
(58) Field of Search .................. 427/96, 424, 427; 118/314, 316; 216/13; 205/145, 137; 134/36

(56) References Cited

U.S. PATENT DOCUMENTS

| | | | |
|---|---|---|---|
| 3,704,165 | * 11/1972 | Mclain et al. | 117/212 |
| 3,935,041 | * 1/1976 | Goffredo et al. | 156/18 |
| 4,425,869 | * 1/1984 | Hull | 118/314 |
| 4,985,111 | * 1/1991 | Ketelhohn | 156/640 |
| 5,000,388 | * 3/1991 | D'Amato | 239/550 |
| 5,297,568 | * 3/1994 | Schmid | 134/62 |
| 5,374,346 | 12/1994 | Bladon et al. | |
| 5,614,264 | * 3/1997 | Himes | 427/424 |
| 5,822,856 | 10/1998 | Bhatt et al. | |
| 6,074,694 | * 6/2000 | Friese et al. | 427/233 |

FOREIGN PATENT DOCUMENTS 5-218625 * 8/1993 (JP).

* cited by examiner

Primary Examiner—Katherine A. Bareford
(74) Attorney, Agent, or Firm—Peter F. Corless; Darryl P. Frickey; Edwards & Angell, LLP

(57) ABSTRACT

The present invention relates to new methods for delivering solutions during electronic device manufacture. Methods of the invention include delivering metallization solutions to the device at an angle of less than 90 degrees with the surface of the device. The method may further comprise partially treating the device by delivering the metallization solutions from above the device, turning the device over, and then completing treatment by delivering the metallization solutions from below the article. The method is particularly useful in the formation of printed circuit boards and other electronic packaging devices having through-holes and blind vias.

8 Claims, 2 Drawing Sheets

FLUID DELIVERY SYSTEMS FOR ELECTRONIC DEVICE MANUFACTURE

BACKGROUND OF THE INVENTION

1. Field of the Invention

This invention relates to the manufacture of electronic devices, and more particularly, to the manufacture of printed circuit boards and other packaging devices having aperatures such as through-holes, buried vias, blind vias and the like. Methods of the invention include delivering various metallization and other solutions to a device substrate such as a printed circuit board substrate, and even more particularly, delivering the various solutions while the device substrate is passing through a conveyorized apparatus.

2. Background

In the manufacture of circuit boards and other electronic packaging devices, particularly in the manufacture of double-sided and multilayer printed circuit boards which contain through-holes, buried vias and blind vias, it is common practice to perform a series of steps whereby the through-holes, and vias are catalyzed by contact with a plating catalyst and metallized to provide electrical connection between the layers of the boards.

Multilayer boards are well-known and are generally comprised of two or more circuit layers, each circuit layer separated from another by one or more layers of dielectric material, which generally is a resin/prepreg composite. Circuit layers are formed from copper clad laminate. Printed circuits are then formed on the copper layers by techniques well known in the art, for example print and etch to define and produce the circuit traces. As referred to herein, the term "multilayer" printed circuit board is inclusive of both double-sided boards and boards with greater than two circuit layers.

One traditional method for fabricating multilayer boards comprises fabrication of separate innerlayers having circuit patterns disposed over their surface. A photosensitive material is coated over the copper surfaces of a copper clad innerlayer material, imaged, developed and etched to form a conductor pattern in the copper cladding protected by the photosensitive coating. After etching, the photosensitive coating is stripped from the copper leaving the circuit pattern on the surface of the base material. Following formation of the innerlayers, a multilayer stack is formed by preparing a lay up of the innerlayers, ground plane layers, power plane layers, etc., typically separated from each other by a dielectric prepeg (a layer containing glass cloth impregnated with partially cured material, typically a B-stage epoxy resin). The stack is laminated to fully cure the B-stage resin.

To electrically interconnect circuit layers within a multilayer board, apertures in the form of through-holes, buried vias and blind vias are formed. These apertures are usually processed by drilling or other means such as laser or plasma treatment. See Clyde F. Coombs, Jr., *Printed Circuits Handbook*, Third Edition, pp.12.5–12.8 (1988). Buried vias are plated through holes connecting two sides of an innerlayer. Blind vias typically pass through one surface of the stack and pass into and stop within the stack.

Throughout the manufacture of printed circuit boards and other electronic packaging devices, a variety of solutions are applied to the device substrate.

Thus, for example, following drilling of the apertures and prior to metal plating, the boards typically require surface roughening and resin desmear of through holes and other apertures to provide electrical interconnection. The roughening and desmear treatment promotes enhanced bond strength and electrical performance of the metal subsequently deposited on the aperture surface. A variety of solutions are applied to the substrate to accomplish the roughening and desmear.

Then, once the circuit board substrate is ready for metal plating, a series of solutions are applied through a number of steps, which generally comprise: (1) treating the surface of the board with a catalyst composition solution to render it catalytically receptive to electroless metal deposition; (2) electroless deposition of a metal over the catalyzed surface by contacting the catalyzed surface with an electroless plating solution; and (3) electrodepositing a plating metal over the electroless metal coating, wherein the electroless metal deposit serves as a conductive surface thereby permitting the electrodeposition. See, for example, C. R. Shipley, Jr., *Plating and Surface Finishing*, vol. 71, pp. 92–99 (1984); and *Metal Finishing Guidebook and Directory*, vol. 86, published by Metals and Plastics Publications, Inc. (1988).

Catalyst solutions usefuil in making the article surface receptive to electroless metal deposition are known in the art and are disclosed in numerous publications including U.S. Pat. No. 3,011,920, incorporated herein by reference. Typically, these solutions comprise palladium metal. Often these solutions are true or colloidal solutions containing palladium and tin compounds.

Methods also have been employed to avoid use of an electroless plating process. For example, "direct" (i.e. no initial electroless deposit) plating procedures have been used, which generally involve application of a catalyst solution and then direct electrolyic plating of the catalyzed surface. See, e.g. U.S. Pat. Nos. 3,099,608, 4,895,739, 4,919,768, 4,952,286, 5,108,786, and 5,071,517.

Regardless of whether electroless or "direct plate" metallization processes are employed, conveyorized processing of the electronic device substrate is typically employed, either with horizontal or vertical process equipment. That is, the device substrate is transported through a manufacturing processing line on a conveyorized transport system.

Vertical processing generally comprises conveyorizing the circuit board substrates in a horizontal path and vertically lowering the boards into treatment tanks or chambers for chemical processing. Such vertical processes typically use panel oscillation as a primary means of solution exchange, with some negligible solution movement achieved through filtering pumps.

Horizontal processing generally comprises conveyorizing the circuit board substrates in a horizontal path through a series of treatment tanks or chambers. Additionally, within the tanks, any one of a number of different fluid delivery devices may be employed. Recently, the industry has moved away from vertical techniques towards horizontal techniques because of the perceived benefits that horizontal techniques have over vertical techniques.

Regardless of the conveyorized equipment style, it is necessary in articles containing through-holes, vias or other aperatures to provide adequate solution movement throughout the through-holes and vias. This presents a particular challenge in horizontal process equipment.

SUMMARY OF THE INVENTION

We have now found new methods of effectively manufacturing articles, such as printed circuit boards and other electronic packaging devices containing aperatures such as through-holes, buried vias and blind vias. Methods of the invention can increase the Yield of plated through-holes and vias and increase the range of via sizes (based on via depth and aspect ratio) that may be effectively metallized.

More particularly, in a first aspect of the invention, we have found that the delivery of solufions at an angle of less than 90 degrees, and even more particularly, less than 70 or 60 degrees, with respect to the device substrate surface can result in improved metallization of the articles, especially improved metallization of aperature walls such as walls of blind vias, through holes and the like. Most preferable are delivery angles of approximately 45 degrees, which have been found to result in fluid flows that are parallel with the surface of the articles. Without being bound by any theory, it is believed that by providing a resulting flow that is parallel to the board surface, micro-turbulence is created within the vias. The micro-turbulence acts to pull air out of the vias, thereby eliminating voids and bubbles to improve the coverage within the vias.

Flow that is "parallel" with the article is to be understood, in accordance with this invention, to refer to flows that travel substantially in alignment with the surface of the article. Specifically, with horizontal conveyorized apparatus, "parallel" flows are also to be understood to refer to flows that extend substantially in alignment with the movement of the article, either in the same direction or in the opposite direction.

Preferably, the methods of the invention may be employed in all or substantially all fluid application steps metallization of a device substrate, including swell/conditioning, etching, neutralization, conditioning, etching, activation, catalyzation, acceleration, electroless plating, cleaning, etching and electroplating.

In a second aspect of the invention, it has been found that improved metallization of articles, especially electronic packaging device substrates containing aperatures such as vias and through-holes, is accomplished while using horizontal process equipment if the article is partially treated with a fluid, the article substantially inverted or turned over, and then the fluid treatment is continued or completed. Without being bound by any theory, it is believed that by turning over the article and completing treatment from below the article, gas bubbles and debris are released from vias and through-holes and the coverage is thereby improved.

The invention includes articles of manufacture, including electronic packaging devices such as printed circuit boards, multichip modules, semiconductor integrated circuits and the like that contain deposits produced from the metallization methods of the invention. The invention includes electroless plating systems, direct plating systems, desmear systems and electroplating systems.

Other aspects of the invention are discussed infra.

DETAILED DESCRIPTION OF THE INVENTION

Figure 1:
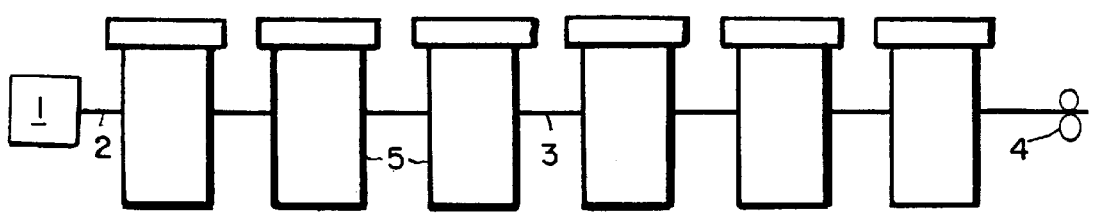
FIG. 1 depicts a horizontal processing sequence in accordance with the present invention.

As discussed above, the metallization methods of the present invention are particularly effective in manufacturing various articles, especially those containing blind vias, buried vias and through-holes. In particular, it has been found that the metallization of articles by passing the articles through an apparatus in a horizontal conveyorized motion yields improved results if, in addition to passing the article horizontally through the treatment tank or chamber, the metallization solutions are delivered at non-perpendicular angles in relation to the article surface. Additionally, it has been found that improved metallization is accomplished in horizontal conveyorized processes by partially treating the article from above, turning the article over, and then completing the treatment from below the article.

The processing of articles, such as printed circuit boards and other electonic packaging devices is well known. See generally, Clyde F. Coombs, Jr., *Printed Circuits Handbook*, Third Edition, pp.12.5–12.8 (1988). For example, in the manufacture of multilayer printed circuit boards, the firrt step generally comprises formation of through-holes and blind vias by drilling, by punching, by photoimaging the through-holes in a sequential multilayer board production process or by any other method known to the art. The article is next passed through a standard desmear process wherein the through-holes and blind vias are desmeared by solutions such as sulfuric acid and chromic acid, followed by plasma etching or etchback with solutions such as chromic acid or permanganate, followed by glass etching. Subsequently, the article is passed through a standard electroless pretreatment line through catalyzation. This is followed by electroless deposition of metal over the catalyzed surfaces. Alternatively, the article may be processed through a standard direct plating process, panel plating process or pattern plating process. Following metal deposition, the metal deposit may optionally be enhanced by electrodepositing a plating metal over the metal coating.

A preferred procedure in accordance with the present invention involves a standard desmear process as follows:

| STEP | PURPOSE |
| --- | --- |
| Solvent swell conditioner; | Penetrates into and softens resin smear |
| Cold water rinse; | |
| Permanganate etch; | Oxidizes and dissolves resin smear |
| Drag out rinse; | |
| Cold water rinse; | |
| Neutralizer; | Reduces and removes residual manganese from etch treatment |
| Cold water rinse; | |

The desmear and etchback processing sequence and chemicals used are well known in the art and are suitable in the practice of the present invention. Additional processing steps may also be employed in combination with the above treatment steps. The process may be accomplished in whole or in part by any of a number of spray nozzles, fluid wedges, or other fluid delivery devices which deliver the particular treatment solutions to the surface of the article.

For example, as a solvent swell conditioner there may be used aqueous formulations, or polar organic solvent formulations, or a solution that is a combination of water and a miscible organic solvent. It is generally preferred to include an organic solvent in the formulation to facilitate treatment of the organic dielectric layer(s) being treated. Suitable organic solvents for use in swell compositions are miscible with water and include e.g. ethers, alcohols, amides, etc. such as glycols e.g. diethylene glycol; ethers such as butyl ether; a dipolar aprotic solvent such as N-methyl pyrrolidinone; and the like. The solvent swell solution may optionally contain a base component. The base component may be a strong base, which is the standard approach, or a weak base. If an alkaline component is included in the sweller composition, it preferably is a relatively weak base. It has been found that weak bases maintain appropriate pH levels and result in lower ionic contamination. For instance, suitable bases for use in a solvent swell composition include e.g. a carbonate such as $Na_2CO_3$ or $NaHCO_3$; organic bases such as triethanolamine and monoethanolamine; substituted ammonium compounds such as tretramethylammonium hydroxide; and the like. Additionally, although less preferred, the sweller composition contains stronger bases (e.g. KOH or NaOH) provided the etchant composition is at a reduced pH.

The solvent swell conditioner is typically employed at an elevated temperature, e.g. at least about 100° F., 120° F. or 140° F., more typically about 160° F. or greater. Times required in application of the solvent swell conditioner vary, e.g. from 1 minute to over 10 minutes. Particularly preferred as a time and temperature is about 5 minutes at about 165° F., as shown in Example 1.

After solvent swell treatment, the device is treated with an etchant solution to remove resin smear that may have occurred during aperture formation, and otherwise condition apertures for subsequent plating. Preferred etchant solutions are aqueous permanganate solutions. However, there have also been used sulfuric acid, chromic acid, and plasma etching methods. The etchant composition is suitably applied at elevated temperatures of at least about 120° F. or 140° F., more typically at about 160° F. for at least about 1 minute and up to and in excess of 10 minutes. Particularly preferred in the practice of the present invention is a permanganate etching solution applied at a temperature of about 170° F. for about 7 minutes, as shown in Example 1.

The etching is then typically followed by a drag out rinse and cold water rinse to completely remove residual materials from the device.

The through-holes and vias may then pass through a post-etch neutralization step, which typically comprises treatment with a strong acid such as sulfuric acid to reduce and remove manganese species present on the device from the preceding etch step. The key ingredient in this step is the reducing agent which solubilizes the manganese dioxide. Typical solutions are acid stable reducing agents, such as hydrogen peroxide used in a sulfuric acid solution (reducing agent) and hydroxylamine nitrate or sulfate. The neutralization composition is suitably applied at elevated temperatures of at least about 50° F. or 60° F., more typically at least about 70° F. for at least about 1 minute and up to and in excess of 10 minutes. Particularly preferred as a temperature and time in the practice of the present invention is about 75° F. for about 3 minutes.

Thereafter, a standard electroless pretreatment line through catalyzation may be carried out. A preferred electroless pretreatment line in accordance with the present invention preferably involves a sequence of steps including treatment of the article with a tin-palladium catalyst to render the surface of the article catalytically receptive to electroless metal deposition. Such a procedure is generally as follows:

| STEP | PURPOSE |
| --- | --- |
| Hole wall conditioner; Cold water rinse; | Removes soils and conditions holes |
| Peroxysulfate etch; Cold water rinse; | Removes copper surface pretreatments, oxidation, and presentation of uniformly active copper |
| Pre-dip for catalyst; | Maintains balance of catalyst step; prevents drag-in of materials from the prior steps and prevents contamination of the catalysis solution |
| Tin-palladium catalyst; Cold water rinse; | Renders the surface catalytically receptive to electroless metal deposition |

The electroless pretreatment processing sequence and chemicals used are well known in the art and are suitable in the practice of the present invention. Additional processing steps may also be employed in combination with the above treatment steps. In addition to passing the article through each treatment tank or chamber, the process may be accomplished in whole or in part by any of a number of spray nozzles, fluid wedges, or other fluid delivery devices which deliver the particular treatment solutions to the surface of the article within the chamber.

Generally, following the desmear process, an electroless pretreatment process begins with application of a hole wall conditioner. Conventional hole wall conditioners are alkaline solutions that are applied at elevated temperature of at least about 100° F. and more typically at least about 120° F. for at least 1 minute and up to and in excess of 10 minutes. Preferably, in the practice of the present invention, a time of about 5 minutes and a temperature of about 120° F. are employed as set forth in Example 1.

After a cold water rinse, an etching step is preferably carried out to remove excess materials from the article surface. Typical etching solutions comprise persulfates and sulfiric acid-hydrogen peroxide solutions. Most preferred in the present invention is a solution of peroxysulfate applied at a temperature of approximately 70° F. for about 1 minute.

Following a cold water rinse, a pre-dip for the catalyst is preferably used prior to catalysis to prevent drag-in of materials from the prior steps thereby preventing contamination of the catalysis solution. Typically, pre-dip solutions have compositions similar to the catalysis solution without the catalytic metal., e.g. an aqueous acid solution of halide ions and stannous tin. Any conventional pre-dip solution is used in accordance with the present invention at a temperature of approximately 75° F. for approximately 1 minute.

Next, catalysis is carried out with any conventional catalysis solution. Typically, catalysis solutions comprise the product resulting from the reduction of a catalytic metal such as palladium by stannous tin in acidic solution. Some catalysis solutions useful in the present invention are disclosed in U.S. Pat. Nos. 3,011,920; 3,532,518; 3,672,938 and 3,874,882, incorporated herein by reference. Most preferably, a tin-palladium catalyst is used in the present invention at an elevated temperature of about 105° F. for about 5 minutes.

Following the above procedure, the device is further processed by electroless deposition of metal over the catalyzed surface. Electroless processes and solutions used are well-known in the art and are suitable in the practice of the present invention. Typically used are electroless copper solutions. Following electroless deopsition, a plating metal may subsequently be electrodeposited over the electroless metal deposit. Electrodeposition and materials used in the process are well-known and are applicable to the present invention.

Referring now to the Figures, which show the preferred processes of the invention, is the device to be manufactured in the form of a double-sided printed circuit board. While the Figures depict treatment of a printed circuit board substrate, it should be understood that a wide variety of other electronic device substrates can be treated in accordance with the present invention. For example, "MID" substrates, i.e. molded interconnect device substrates, can be treated in accordance with the present invention, in the same manner as described herein for treatment of a printed circuit board. Electronic shielding devices such as those used for a computer housing and other electronic devices also may be treated in accordance with the invention. The treatment methods of the invention also may be employed in KGD microelectronic wafer tester fabrication and to build up tab tops for electronic devices. In general, the methods and compositions of the invention may be employed for a wide variety of plating on plastic applications, and is particularly useful for electronic device manufacture.

As shown in FIG. 1, a horizontal processing line is preferably utilized to carry out the above-described steps of the present invention. The process is operated by an operator at control station 1. The control station 1 is used to control the passage of the articles through the horizontal system. Such parameters as solution temperatures and composition and conveyor speed may also be controlled from the control station 1. The horizontal processing equipment illustrated in the drawing is preferably modular. Thus it is possible to make modifications to the line by introducing or deleting particular steps along the line, and by removal or replacement of a module that requires repair.

The beginning of the sequence line is feed station 2, where the articles are manually or automatically fed into the line. The articles are fed onto a conveyor, which carries each article along the sequence line. The conveyor design may be any of the designs commonly used. Preferably, a horizontal conveyor design is used. For example, as shown in FIG. 1, the conveyor may comprise rollers 4 having a rigid core and a single sheet of pliable and/or elastic, rubber-like material 3 upon which the article is moved through the sequence line.

Figure 2:
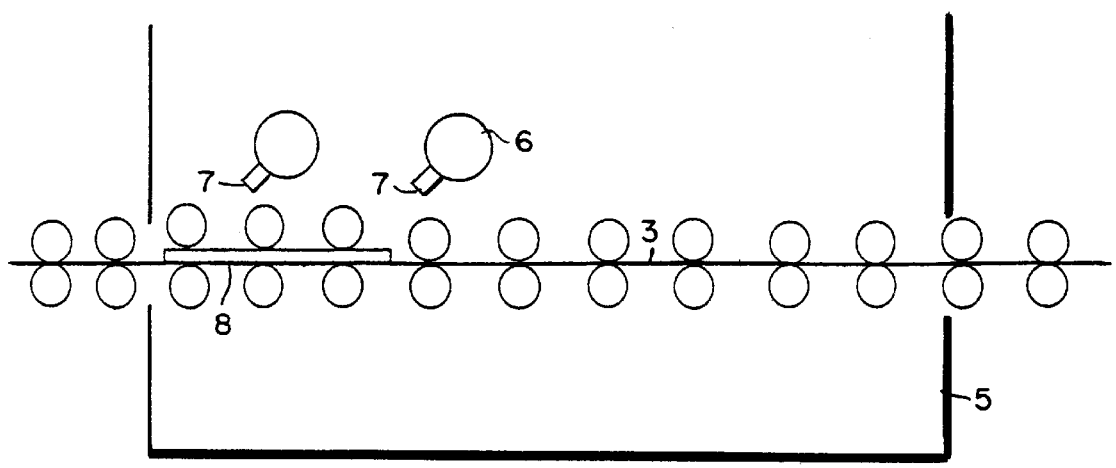
FIG. 2 depicts one configuration of the delivery devices for the metallization solutions in accordance with the present invention.

In accordance with the invention, the article 8 is passed through a series of chambers 5 provided with fluid delivery devices 7 such as spray bars, spray nozzles, slotted sprays and fluid wedges. Preferably, within each chamber 5 is at least one fluid module 6. Each fluid module 6 is equipped with a plurality of fluid delivery devices 7 spaced along the fluid module 6. Within each chamber 5, a particular step in the metallization process is carried out. Thus, for example, in the first chamber 5 conditioning of the article may be carried out, and in the second chamber 5 etching may be carried out, etc. Thus, the first chamber 5 would contain a conditioning solution and the fluid delivery devices 7 would deliver the conditioning solution to the article surface; the second chamber 5 would contain an etching solution and the fluid delivery devices 7 would deliver the etching solution to the article surface. Shown in FIG. 2 is an example of an arrangement of fluid modules 6 and fluid delivery devices 7 within a chamber 5.

The fluid modules 6 and fluid delivery devices 7 are adjustable to various fluid delivery pressures. Most preferably, the fluid is delivered at a pressure in the range of about 0.2 to 0.8 bar. Each chamber 5 is adjustable to the desired temperature range for each process step. Conventional conveyorized methods of delivering materials to an article for a particular length of time may be used. For example, the size of the chamber 5 and the number of fluid modules 6 may be adjustable to deliver each process solution for the appropriate length of time.

In one preferred embodiment, the fluid modules 6 and fluid delivery devices 7 are constructed so as to achieve a resulting material flow that is at an angle of less than 90 degrees with the surface of the article. For example, excellent results are achieved using a series of fluid delivery devices 7 oriented at 45 or more degrees relative to the board. The angle may be with or against the travel path of the board through the chamber 5. The flow may also be directed to achieve a combination of both impinging and parallel flow. Most preferred is a resulting flow that is parallel to the article. It has been found that a flow angle of approximately 45 degrees with or against the path of the board results in a parallel flow and leads to superior results. It is believed that the parallel flow creates micro-turbulence within the vias. The micro-turbulence acts to pull air out of the vias, thereby eliminating voids and bubbles to improve the coverage within the vias.

Figure 5:
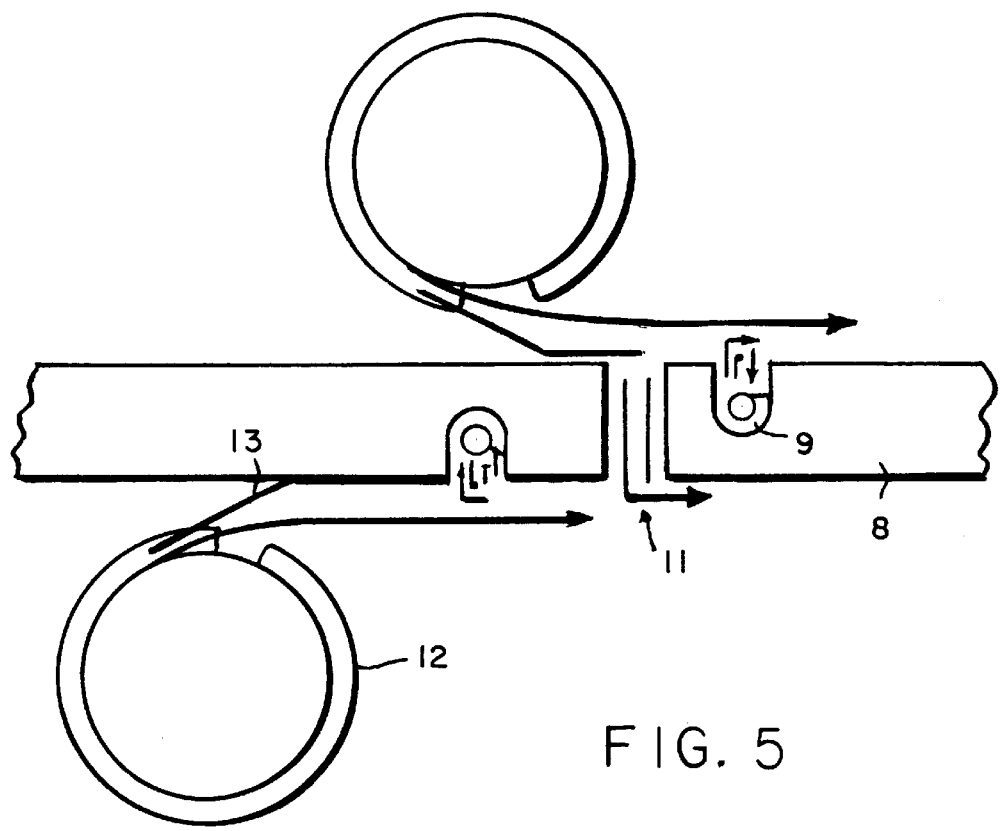
FIG. 5 depicts another type of delivery device for the metallization solutions in accordance with the present invention

Shown in FIG. 5 is another type of delivery apparatus that delivers metallization solutions in a flow parallel to the surface of an article 8 such as a printed circuit board 8 containing vias 9 and through holes 11. The apparatus includes at least one solution pipe 12 filled with a metallization solution. A flex flap 13 may extend from the solution pipe 12 to assist in directing the metallization solution to the article 8 parallel to the article 8 surface.

It is possible to use this method in all of the steps for metallization, including desmear, solvent swell, etching, neutralization, conditioning, pre-dip, activation/catalyzation, acceleration, electroless plating, cleaning and electroplating. However, any number of steps may be carried out using this spraying technique, while others are carried out by immersion in solution baths. It is most preferable, however, to use this spraying technique for all steps, thereby greatly improving the coverage of blind vias and through-holes.

In one test, as set out in Example 2, the number of voided holes was recorded as a function of the type and orientation of the fluid delivery devices 7. With the orientation of fluid delivery devices 7 at 90 degrees to the circuit board, the number of voided holes ranged from 67% to 6%. When the fluid delivery devices 7 were oriented at 45 degrees to the circuit board, the number of voided holes was consistently 0.

Figure 3:
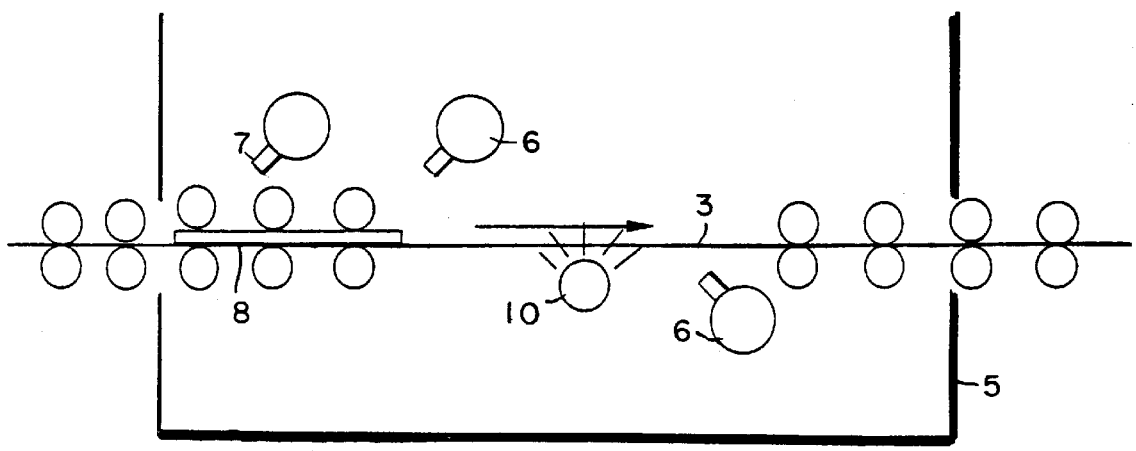
FIG. 3 depicts another configuration of the delivery devices for the metallization solutions in accordance with the present invention.
Figure 4:
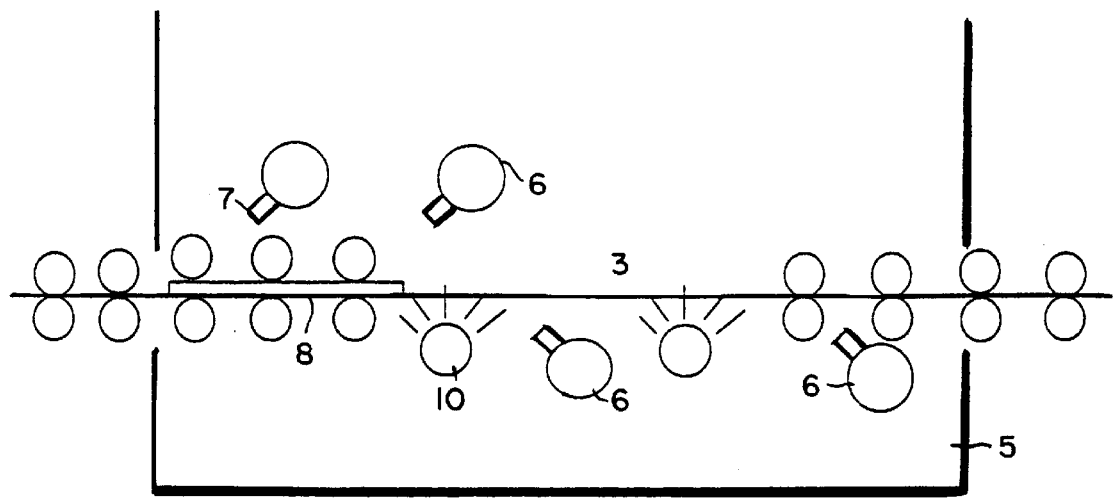
FIG. 4 depicts another configuration of the delivery devices for the metallization solutions in accordance with the present invention.

In another preferred embodiment, the article enters the chamber 5 and is partially treated by fluid delivery devices 7 located above the article. The article is next turned over upside-down, and treatment is completed by fluid delivery devices 7 located below the article. In such an embodiment, one or more of the metallizing solutions are subdivided into at least two fluid modules 6, with a flipping device 10 between each fluid module 6 that turns the article over, for example, as shown in FIG. 3. If both sides of the article are to be treated, there may be, for example, four fluid modules 6 staggered as shown in FIG. 4 such that the first module 6 delivers material from above the article, the second module 6 delivers material from below, the third module 6 delivers material from above and the fourth module 6 delivers material from below. In this type of arrangement, the top of the article is sprayed by the first module 6, the article is flipped by a flipping device 10 between the first and second modules 6, the top of the article is sprayed from below by the second module 6, the bottom of the article is sprayed from above by the third module 6, the article is flipped by a flipping device 10 between the third and fourth modules 6, and finally, the bottom of the article is sprayed from below by the fourth module 6. It is believed that through this type of flipping method, gas bubbles and debris are released from vias and coverage is thereby improved.

The flipping device 10 used to turn the boards over is constructed in any way that handles the boards only on the edges of within 1" or less of the edge so as not to interfere with any functional features on the board surface. The flipping device 10 is constructed so as to not damage the surface of the board in any way. In addition, the total time it takes to turn the board over is minimized to avoid drying of the surface or vias. It may be desirable to use a spray of water or metallizing solution to ensure that the board does not dry out.

Such a board turning procedure may be used in conjunction with the above described procedure in which the fluid modules 6 and fluid delivery devices 7 are arranged so as to provide a flow of material that is delivered at particular angles to the article, thereby improving the results of the metallization procedure even further.

All documents mentioned herein are fully incorporated by reference. The following non-limiting examples are illustrative of the invention.

EXAMPLE 1

General Metallization Method for Printed Circuit Boards

In this example, a printed circuit board test vehicle is constructed with a series of blind vias of varying depths and diameters and processed through desmear, electroloss, and electroplating processes. After electroplating, the outer surface is imaged and etched with the final result being a series of daisy chain circuits connecting the surface (layer 1) with the first inner layer (layer 2). The board is now considered finished. The design of this board is such that an electrical connection between layer 1 and 2 can be made only if the via has been plated with a conductive material, in this case copper.

| STEP | TEMPERATURE | TIME |
| --- | --- | --- |
| Solvent swell conditioner | 165° F. | 5 minutes |
| Cold water rinse | | 4 minutes |
| Permanganate etch | 170° F. | 7 minutes |
| Drag out rinse | | 1 minute |
| Cold water rinse | | 4 minutes |
| Neutralizer | 75° F. | 3 minutes |
| Cold water rinse | | 4 minutes |

Boards were then processed through a standard vertical electroless copper pretreatment line through catalyzation.

| STEP | TEMPERATURE | TIME |
| --- | --- | --- |
| Hole wall conditioner | 120° F. | 5 minutes |
| Cold water rinse | | 4 minutes |
| Peroxysulfate etch | 70° F. | 1 minute |
| Cold water rinse | | 4 minutes |
| Pre-dip for catalyst | 75° F. | 1 minute |

| STEP | TEMPERATURE | TIME |
| --- | --- | --- |
| -continued | | |
| Tin-palladium catalyst | 105° F. | 5 minutes |
| Cold water rinse | | 4 minutes |

Panels were then processed through a horizontal electroless copper bath in accordance with the methods set forth herein.

EXAMPLE 2

Metallization of Printed Circuit Boards at Particular Flow Angles

In this example, the general procedure steps and materials set out in Example 1 were used. In the first trial (trial A), boards were processed using submerged spray modules oriented at 90 degrees to board as it traveled through the horizontal module. In the second trial, (trial B) boards were processed using submerged spray modules oriented at a 45 degree angle with the direction of flow of the board. In the third trial, (trial C) boards were processed using submerged spray modules oriented at a 45 degree angle against the direction of flow of the board. These boards were then electroplated, imaged, and a circuit etched into the top layer hat completed the daisy chain configuration. Then a number of open and closed curcuits was measured; an open circuit is considered a failure and a closed circuit considered a good connection and therefore a pass.

TABLE 1

Results
% Good Circuits in Daisy Chain Coupon

| | 3 mil dia x 4 mil deep | 4 mil dia x 4 mil deep | 10 mil dia x 10 mil deep | 8 mil dia x 10 mil deep |
| --- | --- | --- | --- | --- |
| Trial A | 100 | 100 | 60 | 6 |
| Trial B | 100 | 100 | 100 | 100 |
| Trial C | 100 | 100 | 100 | 100 |

The results show that using a method of pumping fluid at an angle less than 90 degrees to the article enables the production of deeper vias than the use of an impinging flow (i.e. at angles of 90 degrees with the article).

The foregoing description of the invention is merely illustrative thereof, and it is understood that variations and modifications can be effected without departing from the scope or spirit of the invention as set forth in the following claims.

What is claimed:

1. A method for applying solutions on a printed circuit board substrate containing one or more apertures, the method comprising:

a) delivering at least one solution to the top surface of the printed circuit board with a solution delivery device located above the top surface of the printed circuit board;

b) then inverting the printed circuit board;

c) delivering the at least one solution to the inverted top surface of the printed circuit board with a solution delivery device located below the printed circuit board.

2. The method of claim 1 wherein the printed circuit board moves through a horizontal conveyorized apparatus during solution delivery.

3. The method of claim 1 wherein the printed circuit board contains one or more blind vias.

4. The method of claim 1 wherein the solution delivered in step a) and step c) is selected from the group consisting of a desmear composition, a solvent swell composition, an etching composition, a neutralization composition, a conditioning composition, a pre-dip composition, a catalyzation composition, an electroless plating composition, a cleaning composition, and an electroplating composition.

5. The method of claim 1 wherein the solution in step a) is delivered at an angle of from 10 to 70 degrees with respect to the surface of the printed circuit board.

6. The method of claim 1 wherein the solution in step a) is delivered at an angle of from 30 to 60 degrees with respect to the surface of the printed circuit board.

7. The method of claim 1 wherein the solution in step a) is delivered at an angle of from 30 to 45 degrees with respect to the surface of the printed circuit board.

8. The method of claim 1, wherein the solution in step a) is delivered at an angle of approximately 45 degrees with respect to the surface of the printed circuit board.

* * * * *